United States Patent
Kim et al.

(10) Patent No.: US 9,472,153 B2
(45) Date of Patent: Oct. 18, 2016

(54) DISPLAY PANEL AND DISPLAY APPARATUS INCLUDING THE SAME

(71) Applicant: Samsung Display Co., Ltd., Yongin, Gyeonggi-Do (KR)

(72) Inventors: Jang-Il Kim, Asan-si (KR); Sei-yong Park, Suwon-si (KR); Hyoung Cheol Lee, Suwon-si (KR); Sunghee Hong, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 106 days.

(21) Appl. No.: 14/448,169

(22) Filed: Jul. 31, 2014

(65) Prior Publication Data

US 2015/0187309 A1 Jul. 2, 2015

(30) Foreign Application Priority Data

Dec. 31, 2013 (KR) .......................... 10-2013-0168207

(51) Int. Cl.
*G09G 3/36* (2006.01)
*H01L 27/12* (2006.01)
*H01L 29/786* (2006.01)

(52) U.S. Cl.
CPC .......... *G09G 3/3659* (2013.01); *G09G 3/3688* (2013.01); *H01L 27/124* (2013.01); *H01L 29/78669* (2013.01); *H01L 29/78678* (2013.01); *G09G 2300/0404* (2013.01); *G09G 2300/0426* (2013.01); *G09G 2300/08* (2013.01)

(58) Field of Classification Search
CPC combination set(s) only.
See application file for complete search history.

(56) References Cited

U.S. PATENT DOCUMENTS

| | | | |
|---|---|---|---|
| 8,339,534 B2 | 12/2012 | Lee et al. | |
| 2001/0038367 A1* | 11/2001 | Inukai | G09G 3/2022 345/76 |
| 2005/0140578 A1* | 6/2005 | Yamazaki | G02F 1/13454 345/55 |
| 2007/0046607 A1* | 3/2007 | Lai | G09G 3/3648 345/92 |
| 2007/0195029 A1* | 8/2007 | Jeon | G02F 1/13338 345/87 |
| 2008/0019166 A1 | 1/2008 | Jung et al. | |
| 2008/0198283 A1 | 8/2008 | Yoon et al. | |
| 2008/0278467 A1* | 11/2008 | Hwang | G09G 3/3648 345/205 |
| 2013/0093657 A1 | 4/2013 | Song et al. | |

FOREIGN PATENT DOCUMENTS

| | | |
|---|---|---|
| JP | 08-136892 | 5/1996 |
| KR | 10-0251095 B1 | 1/2000 |
| KR | 10-2002-0050040 A | 6/2002 |
| KR | 10-2005-0065784 A | 6/2005 |
| KR | 10-2008-0049272 A | 6/2008 |

* cited by examiner

*Primary Examiner* — Jason Olson
*Assistant Examiner* — Sosina Abebe
(74) *Attorney, Agent, or Firm* — Innovation Counsel LLP

(57) ABSTRACT

A display apparatus includes a plurality of gate lines extending in a first direction, a plurality of data lines extending in a second direction intersecting the first direction, a plurality of auxiliary gate lines extending in the second direction, a plurality of auxiliary data lines extending in the first direction, a display panel including first pixels and second pixels, and a driving part controlling the display panel to display an image. The first pixels are connected to the plurality of gate lines and the plurality of data lines, respectively. The second pixels are connected to the plurality of auxiliary gate lines and the plurality of auxiliary data lines, respectively. The auxiliary gate lines correspond to the gate lines, respectively. Each of the auxiliary gate lines is electrically connected to the corresponding one of the gate lines.

15 Claims, 9 Drawing Sheets

DISPLAY PANEL AND DISPLAY APPARATUS INCLUDING THE SAME

CROSS-REFERENCE TO RELATED APPLICATION

This U.S. non-provisional patent application claims priority under 35 U.S.C. §119 to Korean Patent Application No. 10-2013-0168207, filed on Dec. 31, 2013, in the Korean Intellectual Property Office, the disclosure of which is hereby incorporated by reference herein in its entirety.

BACKGROUND

The inventive concepts relate to a display panel and a display apparatus including the same.

A liquid crystal display apparatus typically includes two display plates and a liquid crystal layer inserted between therebetween. Electric field generating electrodes such as a pixel electrode and a common electrode are formed on the two display plates. Voltages are applied to the electric field generating electrodes to generate an electric field in the liquid crystal layer. The electric field aligns liquid crystal molecules in the liquid crystal layer to control polarization of incident light, so that an image is displayed.

The liquid crystal display apparatus also includes a switching element connected to each pixel electrode, and a plurality of signal lines including gate lines and data lines. The signal lines control the switching element to apply a voltage to the pixel electrode.

Such liquid crystal display apparatuses are widely used in televisions and computers. As demand for large-sized display apparatuses has increased, the numbers of pixels, gate lines and data lines have been increased. The charging time for one pixel is in inverse proportion to the number of total gate lines. Thus, the pixel charging time should become shorter as the number of gate lines increases. Additionally, it is difficult to provide sufficient charging time for each pixel in high speed liquid crystal display apparatuses.

SUMMARY

Embodiments of the inventive concepts may provide a display panel including a pixel structure capable of increasing pixel charging time.

Embodiments of the inventive concepts may also provide a display apparatus including a display panel capable of increasing pixel charging time.

In one aspect, a display apparatus includes: a plurality of gate lines extending in a first direction; a plurality of data lines extending in a second direction intersecting the first direction; a plurality of auxiliary gate lines extending in the second direction; a plurality of auxiliary data lines extending in the first direction; a display panel including first pixels and second pixels, the first pixels connected to the plurality of gate lines and the plurality of data lines, respectively, and the second pixels connected to the plurality of auxiliary gate lines and the plurality of auxiliary data lines, respectively; and a driving part controlling the display panel to display an image. The auxiliary gate lines correspond to the gate lines, respectively. Each of the plurality of auxiliary gate lines is electrically connected to the corresponding one of the plurality of gate lines.

In some embodiments, the first pixels and the second pixels are alternately arranged in each of the first and second directions.

In some embodiments, the plurality of auxiliary gate lines correspond to plurality of data lines, respectively, and each of the plurality of auxiliary gate lines is disposed adjacent to the corresponding one of the plurality of the data lines.

In some embodiments, the plurality of auxiliary data lines correspond to the plurality of gate lines, respectively, and each of the plurality of auxiliary data lines is disposed adjacent to the corresponding one of the plurality of gate lines.

In some embodiments, the driving part includes: a timing controller outputting a first data signal, a first control signal, a second data signal, a second control signal, and a third control signal in response to an image signal and a control signal inputted from an external system; a first data driver driving the plurality of data lines in response to the first data signal and the first control signal; a second data driver driving the plurality of auxiliary data lines in response to the second data signal and the second control signal; and a gate driver driving the plurality of gate lines in response to the third control signal.

In some embodiments, the first data driver is disposed adjacent to a first long side of the display panel, and the second data driver is disposed adjacent to a first short side of the display panel.

In some embodiments, the gate driver is disposed adjacent to a second short side of the display panel.

In some embodiments, the gate driver is disposed adjacent to a second long side of the display panel and the number of the plurality of gate lines is smaller than the number of the plurality of data lines.

In some embodiments, the display apparatus further includes: connecting parts electrically connecting the plurality of auxiliary gate lines to the plurality of gate lines, respectively.

In some embodiments, the first direction is perpendicular to the second direction.

In another aspect, a display panel includes: a gate line extending in a first direction; a data line extending in a second direction intersecting the first direction; an auxiliary gate line extending in the second direction; a first connecting part electrically connecting the gate line to the auxiliary gate line; an auxiliary data line extending in the first direction; a first pixel electrode connected to the data line; a first transistor connected to the gate line and the first pixel electrode; a second pixel electrode connected to the auxiliary data line; and a second transistor connected to the auxiliary gate line and the second pixel electrode.

In some embodiments, the display panel further includes: a second connecting part electrically connecting the second pixel electrode to the auxiliary data line.

In some embodiments, the first pixel electrode and the second pixel electrode are adjacent to each other and are arranged in the second direction.

In some embodiments, the gate line and the auxiliary data line are adjacent to each other with a predetermined distance therebetween.

In some embodiments, the data line and the auxiliary gate line are adjacent to each other with a predetermined distance therebetween.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
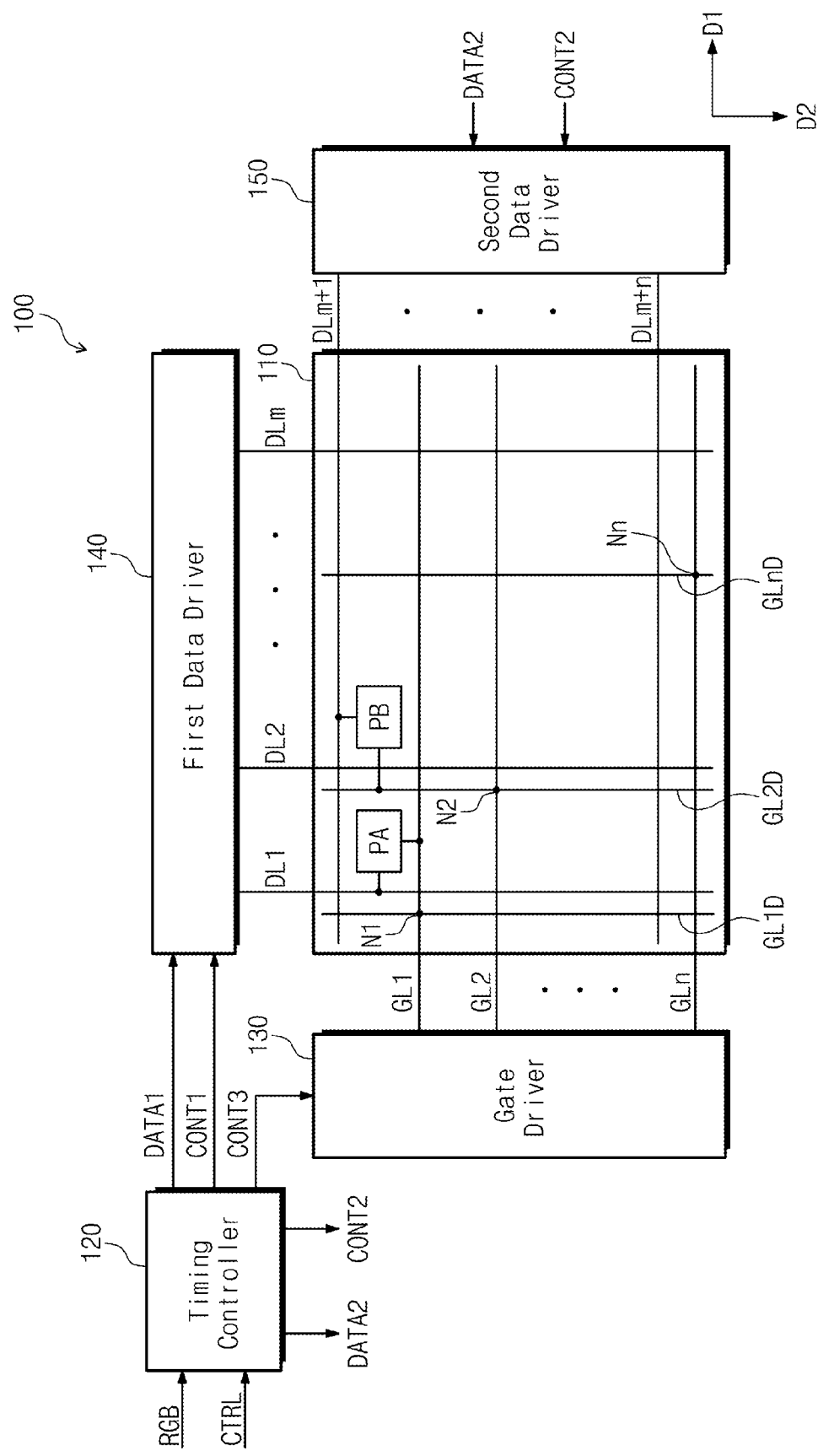
FIG. 1 is a diagram illustrating a circuit configuration of a display apparatus according to some embodiments of the inventive concepts.

The inventive concepts will now be described more fully with reference to the accompanying drawings, in which exemplary embodiments of the inventive concepts are shown. The advantages and features of the inventive concepts and methods of achieving them will be apparent from the following exemplary embodiments. It should be noted, however, that the inventive concepts are not limited to the following exemplary embodiments, and may be implemented in various forms. In the drawings, various features are exaggerated for clarity.

FIG. 1 is a diagram illustrating a circuit configuration of a display apparatus according to some embodiments of the inventive concepts.

Referring to FIG. 1, a display apparatus 100 includes a display panel 110, a timing controller 120, a gate driver 130, a first data driver 140, and a second data driver 150.

The display panel 110 includes a plurality of gate lines GL1 to GLn extending in a first direction D1, a plurality of data lines DL1 to DLm intersecting the plurality of gate lines GL1 to GLn and extending in a second direction D2, a plurality of first pixels PA, and a plurality of second pixels PB. The first pixels PA and the second pixels PB are arranged at crossing regions of the gate lines GL1 to GLn and the data lines DL1 to DLm in a matrix form. The display panel 110 further includes a plurality of auxiliary gate lines GL1D to GLnD extending in the second direction D2 and a plurality of auxiliary data lines DLm+1 to DLm+n extending in the first direction D1.

Figure 2:
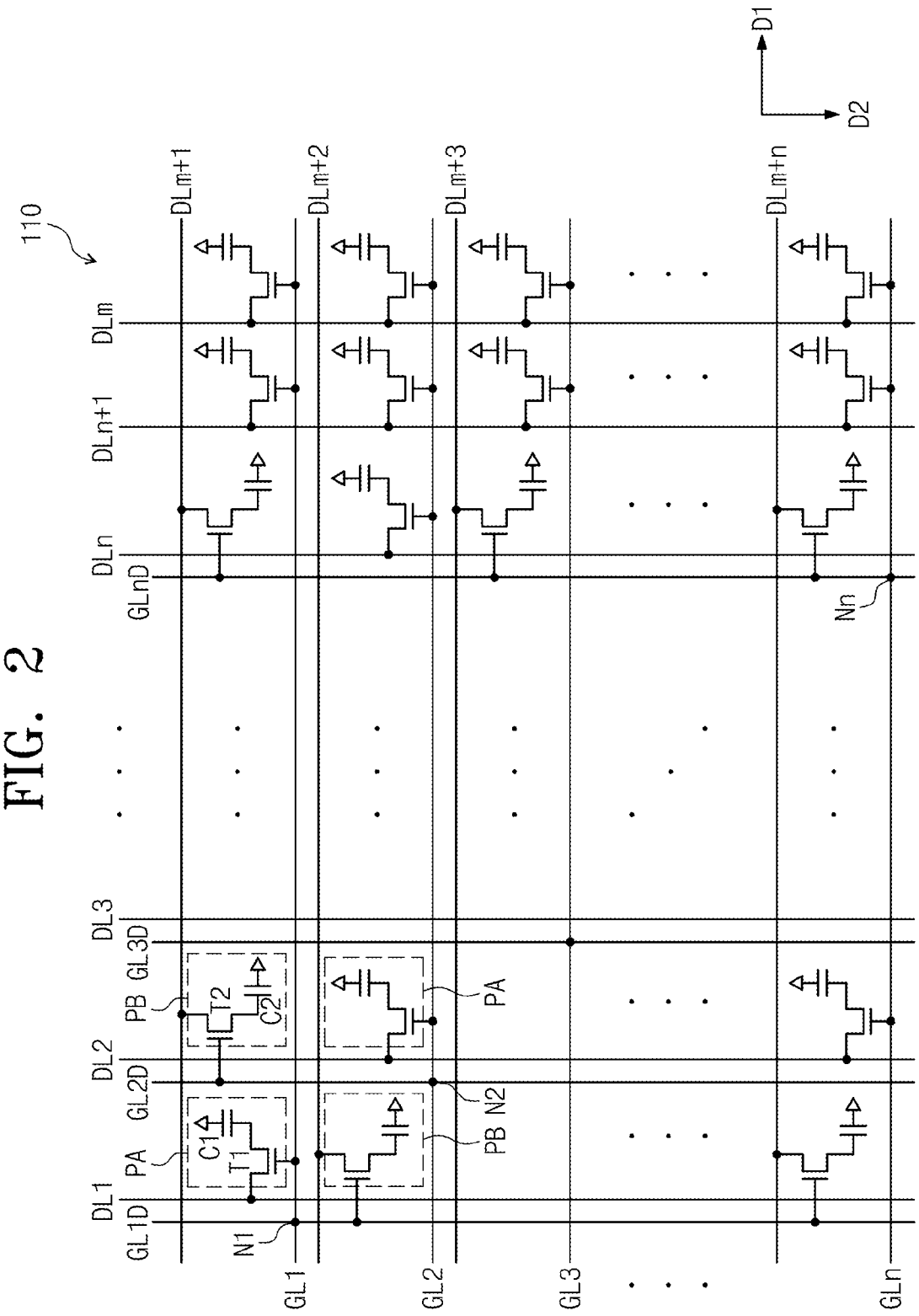
FIG. 2 is a circuit diagram illustrating an arrangement of pixels in the display panel illustrated in FIG. 1.

FIG. 2 is a circuit diagram illustrating an arrangement of pixels in the display panel illustrated in FIG. 1.

Referring to FIG. 2, the plurality of auxiliary gate lines GL1D to GLnD correspond to the plurality of gate lines GL1 to GLn, respectively. Each of the plurality of auxiliary gate lines GL1D to GLnD is electrically connected to the corresponding one of the plurality of gate lines GL1 to GLn. The plurality of auxiliary gate lines GL1D to GLnD are connected to the plurality of the gate lines GL1 to GLn through connecting nodes N1 to Nn, respectively. In the present embodiments, "m" and "n" denote positive integers, respectively. If "m" is greater than "n" (m>n), the number of the plurality of auxiliary data lines DLm+1 to DLm+n is equal to the number of the plurality of gate lines GL1 to GLn. The plurality of auxiliary gate lines GL1D to GLnD correspond to the plurality of data lines DL1 to DLn, respectively. Each of the plurality of auxiliary gate lines GL1D to GLnD is adjacent to the corresponding one of the date lines DL1 to DLn and is spaced apart from the corresponding one with a predetermined distance therebetween.

The gate lines GL1 to GLn and the auxiliary gate lines GL1D to GLnD are insulated from the data lines DL1 to DLm and the auxiliary data lines DLm+1 to DLm+n. Additionally, the data lines DL1 to DLm are insulated from the auxiliary data lines DLm+1 to DLm+n.

The first pixels PA are connected to the gate lines GL1 to GLn and the data lines DL1 to DLm, respectively. The second pixels PB are connected to the auxiliary gate lines GL1D to GLnD and the auxiliary data lines DLm+1 to DLm+n, respectively. The first pixels PA and the second pixels PB are alternately arranged in each of the first and second directions D1 and D2.

Each of the first pixels PA includes a switching transistor T1 connected to a corresponding data line and a corresponding gate line and a liquid crystal capacitor C1 connected to the switching transistor T1. Each of the second pixels PB includes a switching transistor T2 connected to a corresponding auxiliary data line and a corresponding auxiliary gate line and a liquid crystal capacitor C2 connected to the switching transistor T2.

Referring again to FIG. 1, the timing controller 120 is provided with an image signal RGB and control signals CTRL from an external system. The control signals CTRL controls displaying of the image signal RGB. For example, the control signals CTRL may include a vertical synchronization signal, a horizontal synchronization signal, a main clock signal, and a data enable signal. The timing controller 120 provides a first data signal DATA1 and a first control signal CONT1 to the first data driver 140 and provides a second data signal DATA2 and a second control signal CONT2 to the second data driver 150 in response to the control signals CTRL and the image signal RGB. The timing controller 120 provides a third control signal CONT3 to the gate driver 130 in response to the control signals CTRL and the image signal RGB. The first control signal CONT1 and the second control signal CONT2 may include a horizontal synchronization start signal, a clock signal, and a line latch signal, and the third control signal CONT3 may include a vertical synchronization start signal and an output enable signal.

The gate driver 130 drives the plurality of gate lines GL1 to GLn and the plurality of auxiliary gate lines GL1D to GLnD electrically connected to the plurality of gate lines GL1 to GLn in response to the third control signal CONT3 provided from the timing controller 120.

The gate driver 130 may be realized as a circuit formed using at least one of an amorphous silicon gate (ASG), an oxide semiconductor, a single-crystalline semiconductor, and a poly-crystalline semiconductor. Thus, the gate driver 130 and the display panel 110 may be formed on the same substrate. In other embodiments, the gate driver 130 may be realized as a gate driving integrated circuit, so as to be connected to a first short side of the display panel 110.

The first data driver 140 drives the data lines DL1 to DLm in response to the first data signal DATA1 and the first control signal CONT1 provided from the timing controller 120. The second data driver 140 drives the auxiliary data lines DLm+1 to DLm+n in response to the second data signal DATA2 and the second control signal CONT2 provided from the timing controller 120.

While a gate driving signal of a gate on voltage level is applied to one of the gate lines GL1 to GLn by the gate driver 130, the switching transistors T1 connected thereto are turned-on to provide grayscale voltages from the first data driver 140 through the data lines DL1 to DLm to liquid crystal capacitors C1. Thus, the first pixels PA may display an image. Additionally, while the gate driving signal of the gate on voltage level is applied to one of the auxiliary gate lines GL1D to GLnD by the gate driver 130, the switching transistors T2 connected thereto are turned-on to provide grayscale voltages from the second data driver 150 through the data lines DLm+1 to DLm+n to liquid crystal capacitors C2. Thus, the second pixels PB may display an image. Here, a time for which the switching transistors of one row are turned-on is defined as "one horizontal period (1H)".

In the embodiment illustrated in FIG. 1, the gate driver 130 is disposed adjacent to the first short side of the display panel 110, and the first data driver 140 is disposed adjacent to a first long side of the display panel 110. The second data driver 150 is disposed adjacent to a second short side of the display panel 110.

Figure 3:
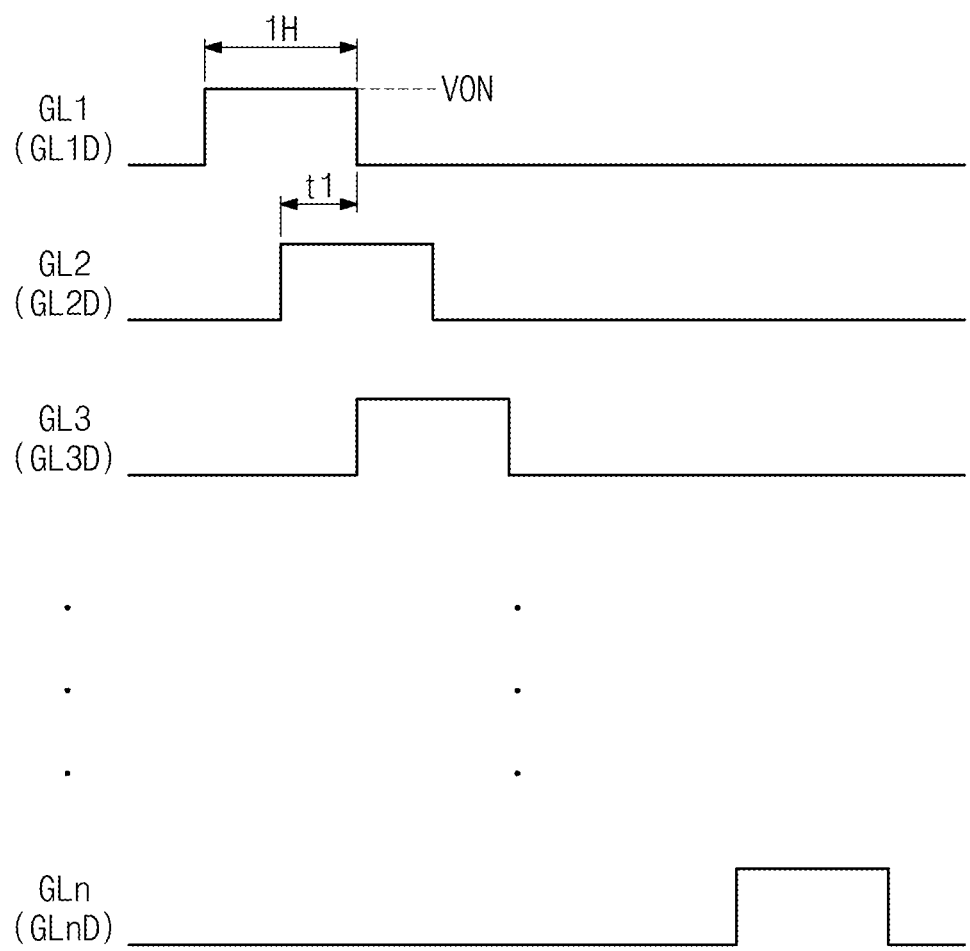
FIG. 3 is a timing diagram illustrating gate signals provided to gate lines illustrated in FIG. 1.

FIG. 3 is a timing diagram illustrating gate signals provided to gate lines illustrated in FIG. 1.

Referring to FIGS. 2 and 3, the gate lines GL1 to GLn are sequentially driven at a level of a gate on voltage VON. Additionally, the auxiliary gate lines GL1D to GLnD are sequentially driven at the gate on voltage VON. The switching transistor T1 in each of the first pixels PA and the switching transistor T2 in each of the second pixels PB are turned-on to charge the capacitors C1 and C2 for a time for which each of the gate lines GL1 to GLn and each of the auxiliary gate lines GL1D to GLnD are driven by the gate on voltage VON, i.e., the one horizontal period (1H).

As illustrated in FIG. 2, the number of the pixels connected to one data line is n/2. If the number of the pixels charged for the one horizontal period (1H) is reduced from n to n/2, a charging time of each of the pixels may be doubled. Thus, driving times of adjacent gate lines at the level of the gate on voltage VON may partially overlap with each other, and the one horizontal period (1H) may increase by the overlapping time t1. The charging times of the first and second pixels PA and PB increase to improve the display quality of the display apparatus.

Figure 4:
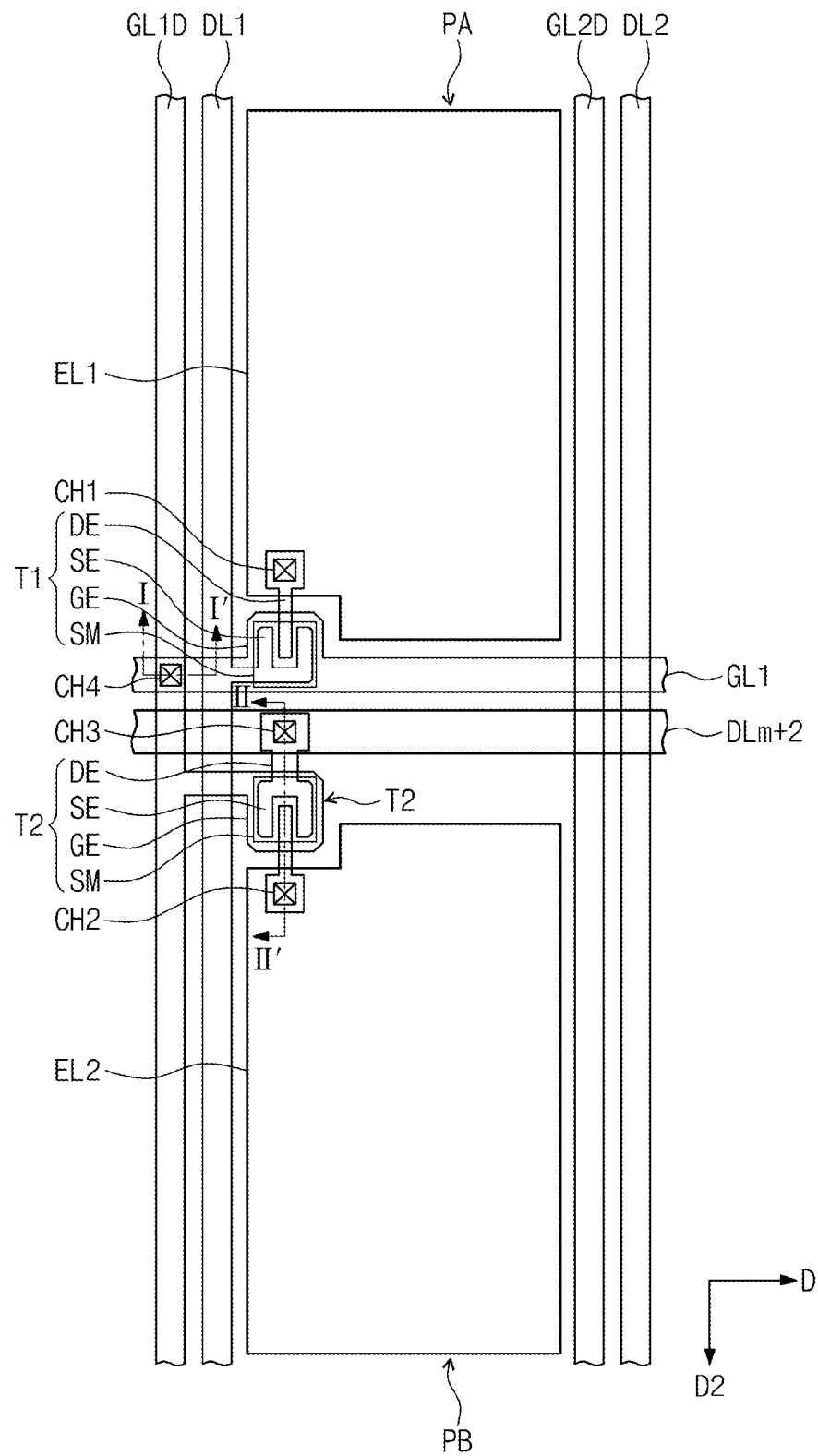
FIG. 4 is a plan view illustrating a portion of the display panel illustrated in FIG. 2.
Figure 5:
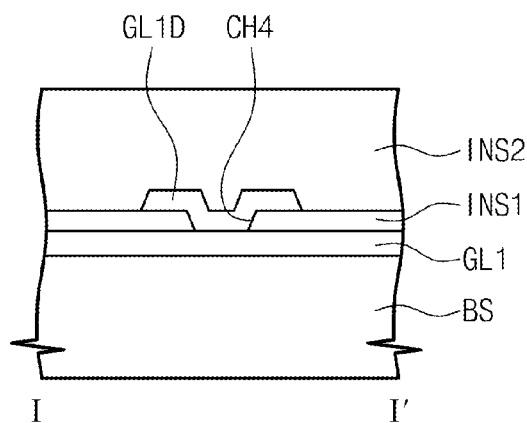
FIG. 5 is a cross-sectional view taken along the line I-I' of FIG. 4.
Figure 6:
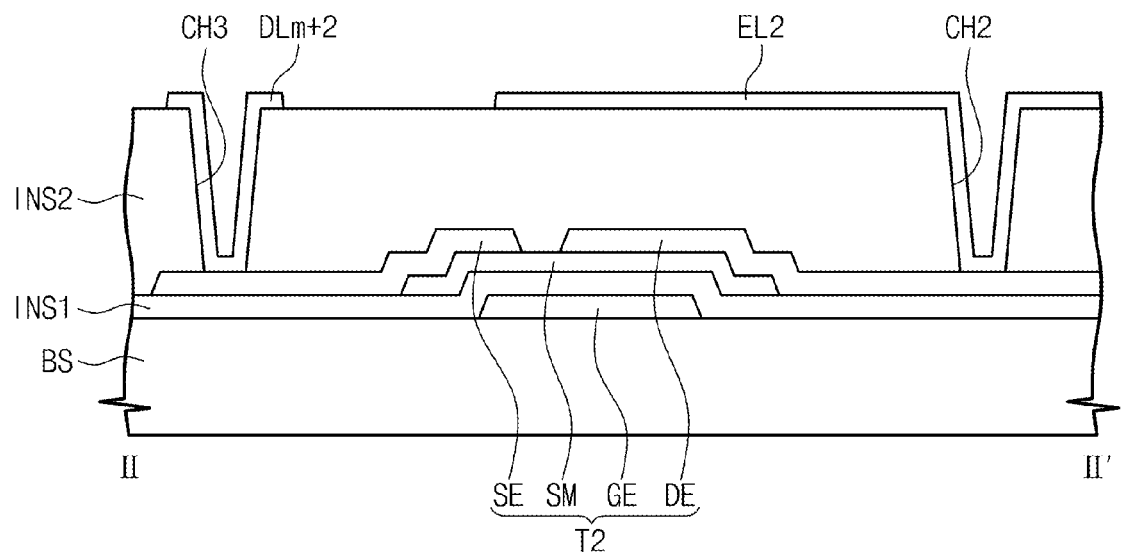
FIG. 6 is a cross-sectional view taken along the line II-II' of FIG. 4.

FIG. 4 is a plan view illustrating a portion of the display panel illustrated in FIG. 2. FIG. 5 is a cross-sectional view taken along the line I-I' of FIG. 4. FIG. 6 is a cross-sectional view taken along the line II-II' of FIG. 4.

Referring to FIGS. 4 to 6, a base substrate BS may be a transparent or non-transparent insulating substrate. For example, the base substrate BS may be a silicon substrate, a glass substrate, or a plastic substrate. The base substrate BS includes pixel regions which correspond to a plurality of pixels, respectively. In the present embodiment, since the display panel 110 includes the first pixels PA and the second pixels PB, the base substrate BS includes first pixel regions and second pixel regions. The first pixel regions and the second pixel regions are alternately arranged in each of first and second directions D1 and D2.

An interconnection part and thin film transistors T1 and T2 are provided on the base substrate BS. The interconnection part transmits signals to the pixels, and the thin film transistors T1 and T2 drive the pixels. The interconnection part includes a gate line GL1, auxiliary gate lines GL1D and GL2D, data lines DL1 and DL2, and auxiliary data lines DLm+1 and DLm+2. The gate line GL1 and the auxiliary data lines DLm+1 and DLm+2 extend in the first direction D1 on the base substrate BS, and the data lines DL1 and DL2 and the auxiliary gate lines GL1D and GL2D extend in the second direction D2 on the base substrate BS.

The data lines DL1 and DL2 are insulated from the gate line GL with a first insulating layer INS1 therebetween on the base substrate BS. The first insulating layer INS1 is provided on the gate line GL1. The first insulating layer INS1 may be formed of an insulating material. For example, the first insulating layer may include silicon nitride ($SiN_x$) or silicon oxide ($SiO_x$). The data lines DL1 and DL2 extend in the second direction D2 intersecting the first direction D1.

The gate line GL1 and the auxiliary gate lines GL1D and GL2D may include at least one of an aluminum-based metal (e.g., aluminum (Al) or an aluminum alloy), a silver-based metal (e.g., silver (Ag) or an silver alloy), a copper-based metal (e.g., copper (Cu) or an copper alloy), a molybdenum-based metal (e.g., molybdenum (Mo) or an molybdenum alloy), chrome (Cr), tantalum (Ta), and titanium (Ti). In some embodiments, the gate line GL1 and the auxiliary gate lines GL1D and GL2D may have a multi-layered structure including at least two stacked conductive layers having different physical properties from each other. A first conductive layer of the conductive layers of the multi-layered structure may be formed of a metal capable of reducing signal delay and voltage drop, e.g., the aluminum-based metal, the silver-based metal, or the copper-based metal. A second conductive layer of the multi-layered structure may be formed of a different material from the first conductive layer. In particular, the second conductive layer may be formed of a material having excellent chemical, physical and electrical contact characteristics with respect to indium-tin oxide (ITO) and indium-zinc oxide (IZO). For example, the second conductive layer may be formed of the molybdenum-based metal, chrome, titanium, or tantalum. In some embodiments, the multi-layered structure may include a chrome layer and an aluminum (alloy) layer which are sequentially stacked. In other embodiments, the multi-layered structure may include an aluminum (alloy) layer and a molybdenum (alloy) layer which are sequentially stacked. However, the inventive concepts are not limited thereto. The gate line GL1 and the auxiliary gate lines GL1D and GL2D may be formed of a stack of other metals and other conductive materials.

The thin film transistor T1 in the first pixel PA is connected to the gate line GL1 and the data line DL1. The thin film transistor T1 includes a gate electrode GE, a semiconductor layer SM, a source electrode SE, and a drain electrode DE. The thin film transistor T2 in the second pixel PB is connected to the auxiliary gate line GL1D and the auxiliary data line DL1m+2. The thin film transistor T2 includes a gate electrode GE, a semiconductor layer SM, a source electrode SE, and a drain electrode DE. The gate electrode GE may protrude from the gate line GL1 or may be provided on a region of the gate line GL1.

The first insulating layer INS1 is disposed on an entire top surface of the base substrate BS to cover the gate electrode GE. The semiconductor layer SM is provided on the gate electrode GE with the first insulating layer INS1 therebetween. The semiconductor layer SM is formed of a hydrogenated amorphous silicon or poly-silicon.

A contact hole CH4 is formed in the first insulating layer INS1. The contact hole CH4 exposes a portion of the gate line GL1. The auxiliary gate line GL1D is formed on the first insulating layer INS1. The gate line GL1 is physically and electrically connected to the auxiliary gate line GL1D through the contact hole CH4. The auxiliary gate line GL1D receives a gate signal from the gate driver 130 of FIG. 1 through the gate line GL1.

The source electrode SE of the first pixel PA is diverged from the data line DL1 and overlaps with the semiconductor layer SM. The drain electrode DE of the first pixel PA is spaced apart from the source electrode SE on the semiconductor layer SM. Here, the semiconductor layer SM includes a conductive channel between the source electrode SE and the drain electrode DE.

A second insulating layer INS2 is disposed on the entire top surface of the base substrate BS to cover the source electrode SE and the drain electrode DE of the first pixel PA. The second insulating layer INS2 may be formed of an inorganic insulating material or an organic insulating material and may have a planarized top surface. For example, the inorganic insulating material may be silicon nitride or silicon oxide. Contact holes CH1, CH2 and CH3 exposing portions of the source and drain electrodes SE and DE are formed in the second insulating layer INS2.

Pixel electrodes EL1 and EL2 and the auxiliary data line DLm+2 are formed on the second insulating layer INS2. The pixel electrode EL2 of the second pixel PB is physically and electrically connected to the drain electrode DE of the second pixel PB through the contact hole CH2. The pixel electrode EL2 of the second pixel PB receives a grayscale voltage through the drain electrode DE of the second pixel PB. The source electrode SE of the second pixel PB is physically and electrically connected to the auxiliary data line DLm+2 through the contact hole CH3 to receive the grayscale voltage through the auxiliary data line DLm+2.

The source electrode SE and the drain electrode DE of each of the first and second pixels PA and PB may be formed of a conductive material, e.g., a metal. Each of the source electrode SE and the drain electrode DE may be formed of a single metal. However, the inventive concepts are not limited thereto. In other embodiments, the source electrode SE and the drain electrode DE may be formed of two or more kinds of metals or two or more kinds of metal alloys. The metal may include at least one of nickel, chrome, molybdenum, aluminum, titanium, copper, tungsten, and any alloy thereof. Additionally, each of the source electrode SE and the drain electrode DE may be formed of a single-layer or a multi-layer. For example, each of the source electrode SE and the drain electrode DE may be formed of a double layer of titanium and copper.

Figure 7:
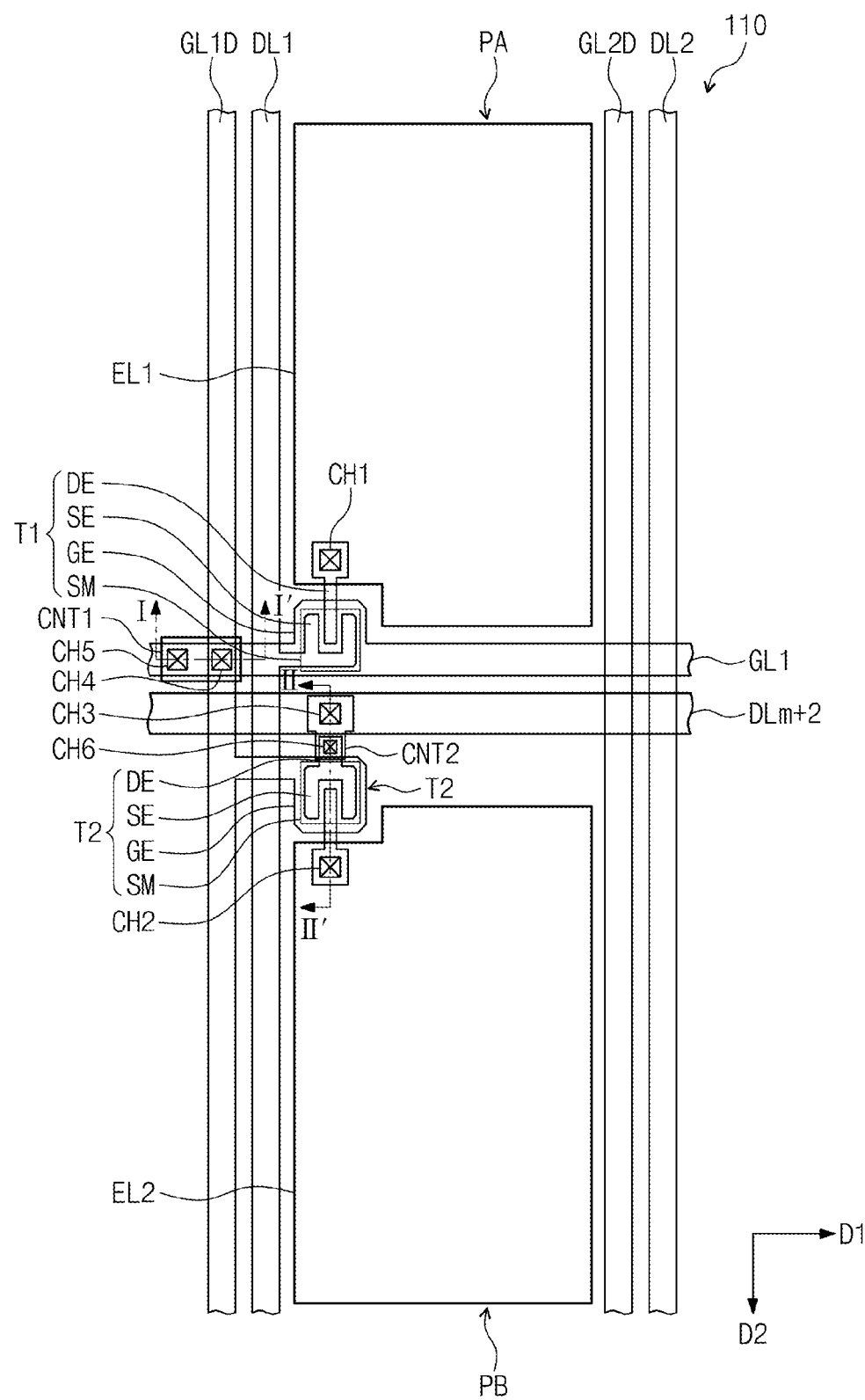
FIG. 7 is a plan view illustrating a portion of the display panel of FIG. 2 according to other embodiments of the inventive concepts.
Figure 8:
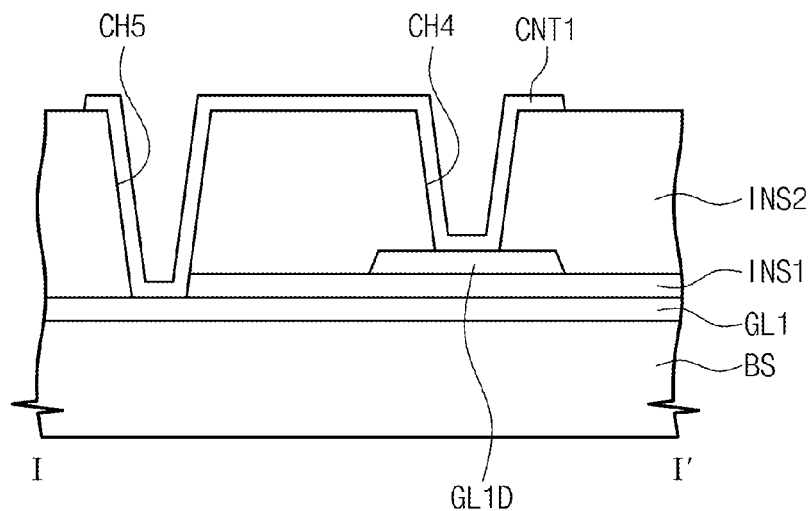
FIG. 8 is a cross-sectional view taken along the line I-I' of FIG. 7.
Figure 9:
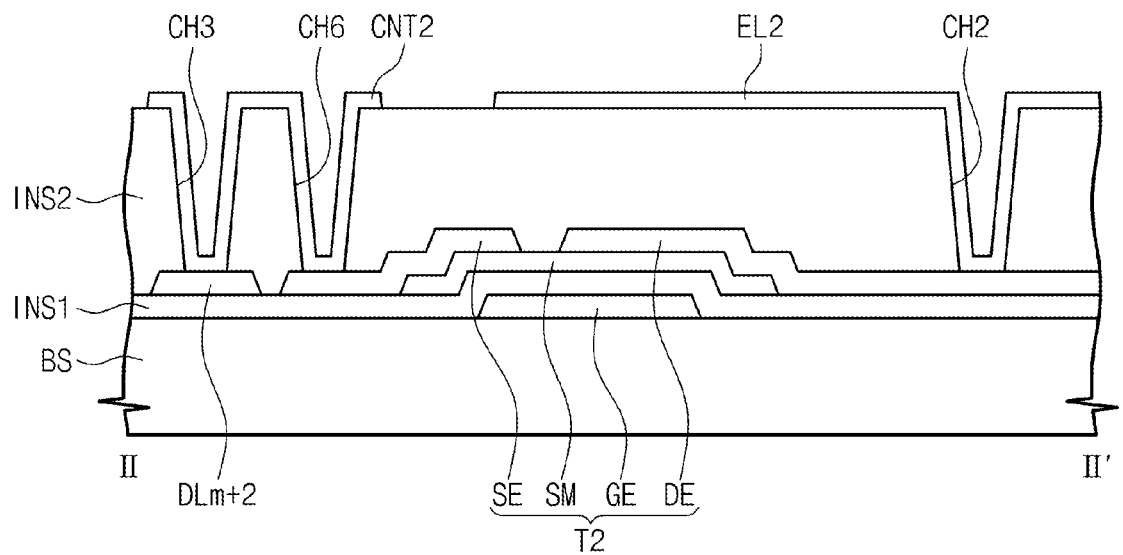
FIG. 9 is a cross-sectional view taken along the line II-II' of FIG. 7.

FIG. 7 is a plan view illustrating a portion of the display panel of FIG. 2 according to other embodiments of the inventive concepts. FIG. 8 is a cross-sectional view taken along the line I-I' of FIG. 7. FIG. 9 is a cross-sectional view taken along the line II-II' of FIG. 7.

The display panel illustrated in FIGS. 7 to 9 has a similar constitution and a similar layer structure to the display panel illustrated in FIGS. 4 to 6. Referring to FIGS. 7 to 9, a base substrate BS includes pixel regions which correspond to a plurality of pixels, respectively. In the present embodiment, since the display panel 110 includes first pixels PA and second pixels PB, the base substrate BS includes first pixel regions and second pixels regions. The first pixel regions and the second pixel regions are alternately arranged in each of first and second directions D1 and D2.

An interconnection part and thin film transistors T1 and T2 driving the pixels are provided on the base substrate BS. The interconnection part transmits signals to the pixels. The interconnection part includes a gate line GL1, auxiliary gate lines GL1D and GL2D, data lines DL1 and DL2, and auxiliary data lines DLm+1 and DLm+2. The gate line GL1 and the auxiliary data lines DLm+1 and DLm+2 extend in the first direction D1 on the base substrate BS, and the data lines DL1 and DL2 and the auxiliary gate lines GL1D and GL2D extend in the second direction D2 on the base substrate BS.

The data lines DL1 and DL2 are insulated from the gate line GL with a first insulating layer INS1 therebetween on the base substrate BS. The first insulating layer INS1 is provided on the gate line GL1. The data lines DL1 and DL2 extend in the second direction D2 intersecting the first direction D1.

The thin film transistor T1 in the first pixel PA is connected to the gate line GL1 and the data line DL1. The thin film transistor T1 includes a gate electrode GE, a semiconductor layer SM, a source electrode SE, and a drain electrode DE. The thin film transistor T2 in the second pixel PB is connected to the auxiliary gate line GL1D and the auxiliary data line DL1m+2. The thin film transistor T2 includes a gate electrode GE, a semiconductor layer SM, a source electrode SE, and a drain electrode DE. The gate electrode GE may protrude from the gate line GL1 or may be provided on a region of the gate line GL1.

The first insulating layer INS1 is disposed on an entire top surface of the base substrate BS to cover the gate electrode GE. The semiconductor layer SM is provided on the gate electrode GE with the first insulating layer INS1 therebetween.

The auxiliary gate lines GL1D and GL2D, the auxiliary data line DLm+2, and a second insulating layer INS2 are formed on the first insulating layer INS1. Contact holes CH4 and CH5 are formed in the first insulating layer INS1 and the second insulating layer INS2. The contact hole CH4 exposes a portion of the auxiliary gate line GL1D, and the contact hole CH5 exposes a portion of the gate line GL1. A connecting member CNT1 is formed on the second insulating layer INS2. The connecting member CNT1 is formed of a transparent conductive material such as indium-tin oxide (ITO) or indium-zinc oxide (IZO). The connecting member CNT1 extends into the contact holes CH4 and CH5 so as to be connected to the gate line GL1 and the auxiliary gate line GL1D. Thus, the gate line GL1 and the auxiliary gate line GL1D are electrically connected to each other through the connecting member CNT1. The auxiliary gate line GL1D receives a gate signal from the gate driver 130 of FIG. 1 through the gate line GL1.

The source electrode SE of the first pixel PA is diverged from the date line DL1 and overlaps with the semiconductor layer SM. The drain electrode DE of the first pixel PA is spaced apart from the source electrode SE on the semiconductor layer SM. Here, the semiconductor layer SM includes a conductive channel between the source electrode SE and the drain electrode DE.

The second insulating layer INS2 is disposed on the entire top surface of the base substrate BS to cover the source electrode SE and the drain electrode DE of the first pixel PA. Contact holes CH1, CH2, CH3, CH4, CH5 and CH6 exposing portions of the source and drain electrodes SE and DE and the auxiliary data line DLm+2 are formed in the second insulating layer INS2.

Pixel electrodes EL1 and EL2 and a connecting member CNT2 are formed on the second insulating layer INS2. The connecting member CNT2 is formed of a transparent conductive material such as indium-tin oxide (ITO) or indium-zinc oxide (IZO). The connecting member CNT2 extends into the contact holes CH5 and CH6 so as to be connected to the auxiliary gate line DLm+2 and the source electrode SE of the second pixel PB. Thus, the auxiliary gate line DLm+2 and the source electrode SE of the second pixel PB are electrically connected to each other through the connecting member CNT2. The source electrode SE of the second pixel PB receives a grayscale voltage from the second data driver 150 of FIG. 1 through the auxiliary data line DLm+2.

Figure 10:
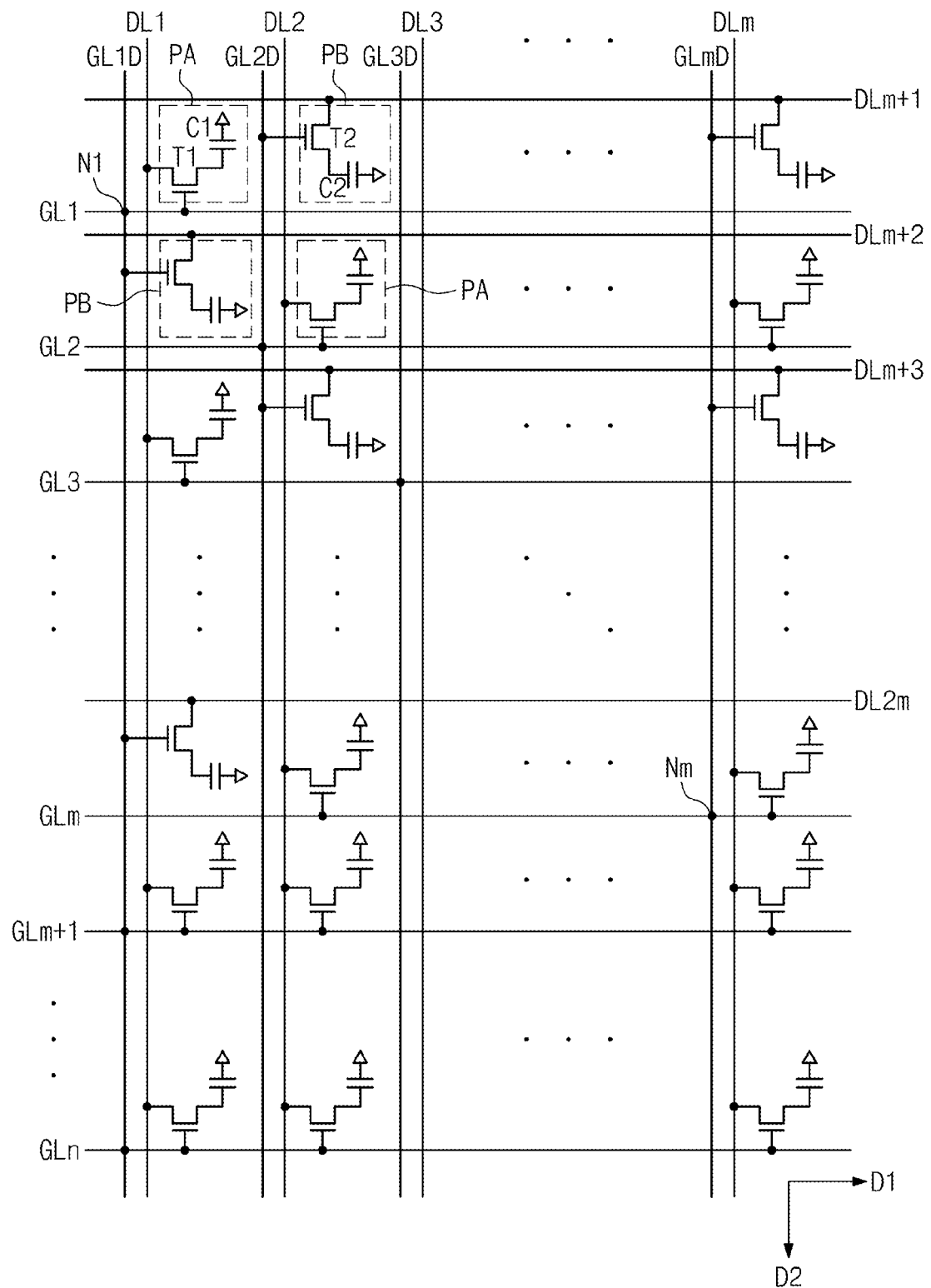
FIG. 10 is a circuit diagram illustrating an arrangement of pixels in the display panel of FIG. 1 according to still other embodiments of the inventive concepts.

FIG. 10 is a circuit diagram illustrating an arrangement of pixels in the display panel of FIG. 1 according to still other embodiments of the inventive concepts.

Referring to FIG. 10, the number of the plurality of gate lines GL1 to GLn disposed on the display panel 110 is greater than the number of the plurality of data lines DL1 to DLm disposed on the display panel 110 (i.e., n>m). In this case, the number of the plurality of auxiliary gate lines GL1D to GLmD is equal to the number of the plurality of data lines DL1 to DLm. Also, the number of the plurality of auxiliary data lines DLm+1 to DL2m is equal to the number of the plurality of data lines DL1 to DLm. The plurality of auxiliary gate lines GL1D to GLmD may correspond to some GL1 to GLm of the plurality of gate lines GL1 to GLn, respectively. Each of the auxiliary gate lines GL1D to GLmD is electrically connected to the corresponding one of the gate lines GL1 to GLm. The auxiliary gate lines GL1D to GLmD are electrically connected to the gate lines GL1 to GLm through connecting nodes N1 to Nm, respectively. The auxiliary gate lines GL1D to GLmD correspond to the data lines DL1 to DLm, respectively. Each of the auxiliary gate lines GL1D to GLmD is adjacent to a corresponding data line but is spaced apart from the corresponding data line by a predetermined distance.

The gate lines GL1 to GLn and the auxiliary gate lines GL to GLmD are insulated from the data lines DL1 to DLm and the auxiliary data lines DLm+1 to DL2m.

First pixels PA are connected to the gate lines GL1 to GLn and the data lines DL1 to DLm, respectively. Second pixels PB are connected to the auxiliary gate lines GL1D to GLmD and the auxiliary data lines DLm+1 to DL2m, respectively. The first pixels PA and the second pixels PB may be alternately arranged in each of first and second directions D1 and D2. Some of the first pixels PA may be connected to the gate lines GLm+1 to GLn which are not connected to the auxiliary gate lines. If the number of the gate lines GL1 to GLn is greater than the number of the data lines DL1 to DLm, the number of the first pixels PA is greater than the number of the second pixels PB.

Figure 11:
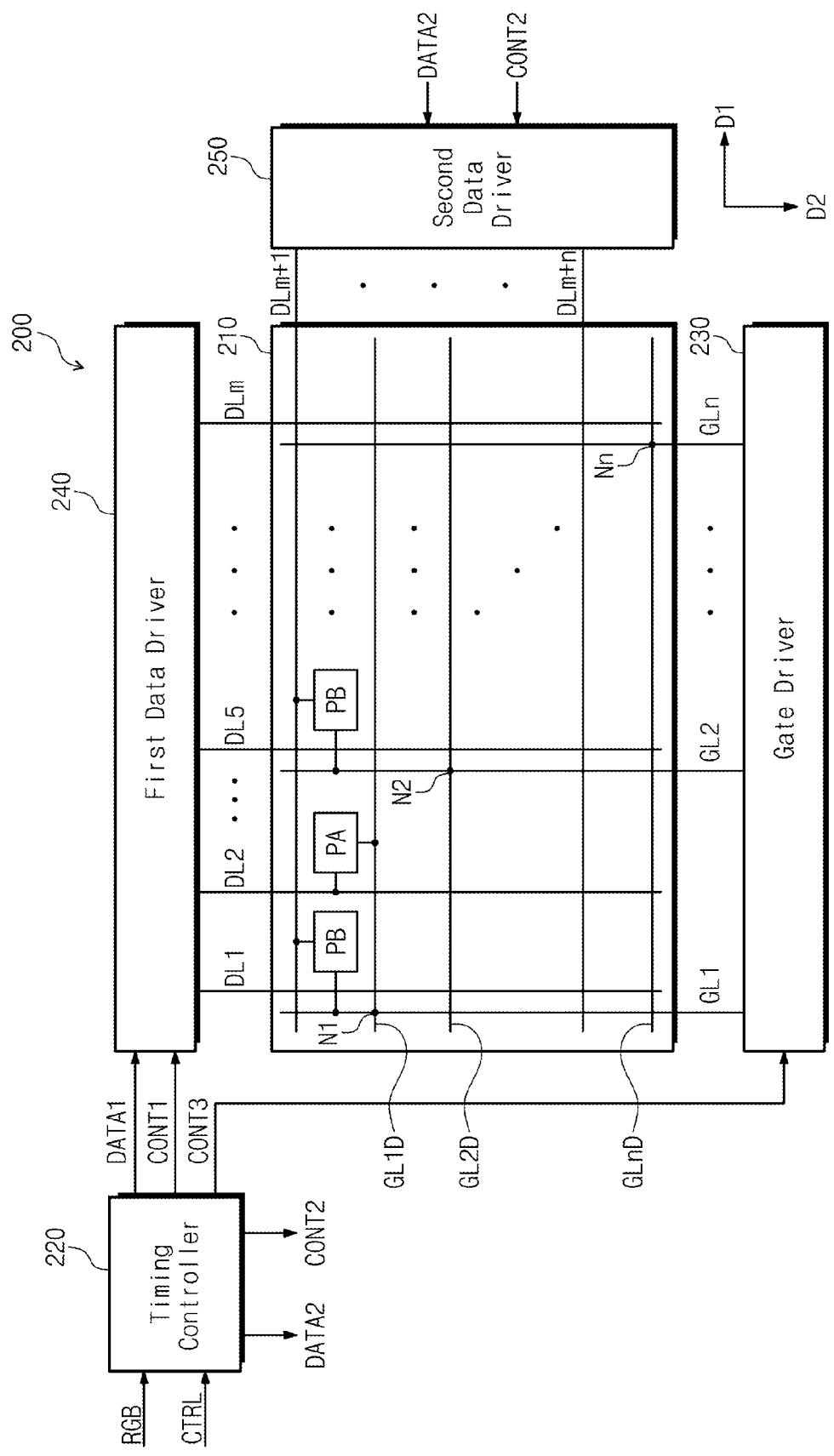
FIG. 11 is a diagram illustrating a circuit configuration of a display apparatus according to yet other embodiments of the inventive concepts.

FIG. 11 is a diagram illustrating a circuit configuration of a display apparatus according to yet other embodiments of the inventive concepts.

Referring to FIG. 11, a display apparatus 200 includes a display panel 210, a timing controller 220, a gate driver 230, a first data driver 240, and a second data driver 250. Functions of the timing controller 220, the gate driver 230, the first data driver 240, and the second data driver 250 are the same as those of the timing controllers 120, the gate driver 130, the first data driver 140, and the second data driver 150 of FIG. 1, respectively, so that the descriptions thereof will be omitted for the purpose of ease and convenience in explanation.

The display panel 210 includes a plurality of auxiliary gate lines GL1D to GLnD extending in a first direction D1, a plurality of auxiliary data lines DLm+1 to DLm+2 extending in the first direction D1, a plurality of gate lines GL1 to GLn extending in a second direction D2, and a plurality of data lines DL1 to DLm extending in the second direction D2.

In the embodiment illustrated in FIG. 11, the first data driver 240 is adjacent to a first long side of the display panel 210, and the second data driver 250 is adjacent to one short side of the display panel 210. The gate driver 230 is adjacent to a second long side of the display panel 210. The gate driver 230 faces the first data driver 240 with the display panel 210 therebetween.

For example, if "m" is equal to 4 times "n" (m=4×n), the gate lines GL1 to GLn respectively correspond to a first data line DL1, a fifth data line DL5, a ninth data line DL9, . . . , a m-th data line DLm of the plurality of data lines DL1 to DLm. The first pixels PA are connected to the auxiliary gate lines GL1D to GLnD and the data lines DL1 to DLm, and the second pixels PB are connected to the gate lines GL1 to GLn and the auxiliary data lines DLm+1 to DLm+n.

If the number of the plurality of the gate lines GL1 to GLn is greater than the number of the plurality of the data lines DL1 to DLm, only first pixels PA are connected to the data lines DLn+1 to DLm as illustrated in FIG. 2.

If the display panel 210 includes the gate lines GL1 to GLn which are arranged to respectively correspond to the first data line DL1, the fifth data line DL5, the ninth data line DL9, . . . , the m-th data line DLm of the plurality of data lines DL1 to DLm, the first pixels PA and the second pixels PB are dispersed on the display panel 210 to prevent deterioration of the displaying quality of the display apparatus.

In the display device according to embodiments of the inventive concepts, the number of the pixels connected to one data line is reduced. Thus, the charging time of the pixel increases to improve the displaying quality of the display apparatus.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A display apparatus comprising:
    a plurality of gate lines extending in a first direction;
    a plurality of data lines extending in a second direction intersecting the first direction;
    a plurality of auxiliary gate lines extending in the second direction;
    a plurality of auxiliary data lines extending in the first direction;
    a display panel including first pixels and second pixels, the first pixels connected to the plurality of gate lines and the plurality of data lines, respectively, and the second pixels connected to the plurality of auxiliary gate lines and the plurality of auxiliary data lines, respectively; and
    a driving part controlling the display panel to display an image,
    wherein the plurality of auxiliary gate lines correspond to the plurality of gate lines, respectively, and
    wherein each of the plurality of auxiliary gate lines is electrically connected to the corresponding one of the plurality of gate lines.

2. The display apparatus of claim 1, wherein the first pixels and the second pixels are alternately arranged in each of the first and second directions.

3. The display apparatus of claim 2, wherein the plurality of auxiliary gate lines correspond to the plurality of data lines, respectively, and
wherein each of the plurality of auxiliary gate lines is disposed adjacent to the corresponding one of the plurality of the data lines.

4. The display apparatus of claim 3, wherein the plurality of auxiliary data lines correspond to the plurality of gate lines, respectively, and
wherein each of the plurality of auxiliary data lines is disposed adjacent to the corresponding one of the plurality of gate lines.

5. The display apparatus of claim 4, wherein the driving part comprises:
a timing controller outputting a first data signal, a first control signal, a second data signal, a second control signal, and a third control signal in response to an image signal and a control signal inputted from an external system;
a first data driver driving the plurality of data lines in response to the first data signal and the first control signal;
a second data driver driving the plurality of auxiliary data lines in response to the second data signal and the second control signal; and
a gate driver driving the plurality of gate lines in response to the third control signal.

6. The display apparatus of claim 5, wherein the first data driver is disposed adjacent to a first long side of the display panel, and
wherein the second data driver is disposed adjacent to a first short side of the display panel.

7. The display apparatus of claim 6, wherein the gate driver is disposed adjacent to a second short side of the display panel.

8. The display apparatus of claim 6, wherein the gate driver is disposed adjacent to a second long side of the display panel and the number of the plurality of gate lines is smaller than the number of the plurality of data lines.

9. The display apparatus of claim 1, further comprising:
connecting parts electrically connecting the plurality of auxiliary gate lines to the plurality of gate lines, respectively.

10. The display apparatus of claim 1, wherein the first direction is perpendicular to the second direction.

11. A display panel comprising:
a gate line extending in a first direction;
a data line extending in a second direction intersecting the first direction;
an auxiliary gate line extending in the second direction;
a first connecting part electrically connecting the gate line to the auxiliary gate line;
an auxiliary data line extending in the first direction;
a first pixel electrode connected to the data line;
a first transistor connected to the gate line and the first pixel electrode;
a second pixel electrode connected to the auxiliary data line; and
a second transistor connected to the auxiliary gate line and the second pixel electrode.

12. The display panel of claim 11, further comprising:
a second connecting part electrically connecting the second pixel electrode to the auxiliary data line.

13. The display panel of claim 11, wherein the first pixel electrode and the second pixel electrode are adjacent to each other and are arranged in the second direction.

14. The display panel of claim 11, wherein the gate line and the auxiliary data line are adjacent to each other with a predetermined distance therebetween.

15. The display panel of claim 11, wherein the data line and the auxiliary gate line are adjacent to each other with a predetermined distance therebetween.

* * * * *